United States Patent
Chaahoub et al.

(10) Patent No.: US 8,995,839 B2
(45) Date of Patent: Mar. 31, 2015

(54) METHOD AND APPARATUS FOR PERFORMING DATA RATE CONVERSION AND PHASE ALIGNMENT

(75) Inventors: Faouzi Chaahoub, San Jose, CA (US); Georgios Asmanis, Lake Forest, CA (US); Samir Aboulhouda, Cupertino, CA (US); Michael A. Robinson, Fremont, CA (US); Ravi T. Kotamraju, Sunnyvale, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 264 days.

(21) Appl. No.: 13/544,199

(22) Filed: Jul. 9, 2012

(65) Prior Publication Data

US 2014/0010546 A1    Jan. 9, 2014

(51) Int. Cl.
*H04B 10/00* (2013.01)
*H03M 9/00* (2006.01)
*G06F 13/00* (2006.01)

(52) U.S. Cl.
CPC *H03M 9/00* (2013.01); *G06F 13/00* (2013.01)
USPC ............ 398/116; 398/117; 398/129; 398/122

(58) Field of Classification Search
CPC ........... H03K 5/01; H03M 9/00; G06F 13/00; H04B 10/00
USPC .................................. 398/116, 117, 129, 122
See application file for complete search history.

(56) References Cited

U.S. PATENT DOCUMENTS

| | | | |
|---|---|---|---|
| 6,625,241 B2 | 9/2003 | Mejiga | |
| 6,665,498 B1 | 12/2003 | Jiang et al. | |
| 6,850,663 B2 | 2/2005 | Kikuchi et al. | |
| 6,932,618 B1 | 8/2005 | Nelson | |
| 6,947,672 B2 | 9/2005 | Jiang et al. | |
| 6,982,879 B1 | 1/2006 | Franca-Neto et al. | |
| 7,050,468 B2 | 5/2006 | Seto et al. | |
| 7,329,054 B1 | 2/2008 | Epitaux et al. | |
| 7,380,993 B2 | 6/2008 | Dallesasse | |
| 7,539,366 B1 | 5/2009 | Baks et al. | |
| 7,729,581 B2 | 6/2010 | Rolston et al. | |
| 7,783,206 B2 | 8/2010 | Reyna et al. | |
| 7,835,648 B2 | 11/2010 | Hofmeister et al. | |
| 7,860,400 B2 | 12/2010 | Cole | |
| 8,047,856 B2 | 11/2011 | McColloch | |
| 8,078,058 B2 | 12/2011 | Zhang et al. | |
| 8,223,768 B2 | 7/2012 | Handelman | |

(Continued)

OTHER PUBLICATIONS

Cole, Chris, "MLG (Multi-Link Gearbox) Project Start Proposal, Powerpoint Presentation", *Optical Internetworking Forum*, Fremont, United States Jul. 8, 2011, 1-13.

(Continued)

*Primary Examiner* — Farley Abad (57) ABSTRACT

A gearbox IC is incorporated into an optical communications system to enable an optical link that incorporates the system to achieve data rates that are at least double that which are currently achievable in optical links. The gearbox IC performs data rate conversion and phase alignment. In the transmit direction, the gearbox IC receives N lanes of electrical data signals having a data rate of X Gbps and outputs N/2 lanes of electrical data signals having a data rate of 2X Gbps. In the receive direction, the gearbox IC receives N/2 electrical data signals having a data rate of 2X Gbps and converts the N/2 electrical data signals into N electrical data signals having a data rate of X.

26 Claims, 7 Drawing Sheets

(56) References Cited

U.S. PATENT DOCUMENTS

| | | | |
|---|---|---|---|
| 8,340,123 B2 | 12/2012 | Barbieri et al. | |
| 8,382,384 B2 | 2/2013 | Nekado et al. | |
| 8,433,202 B2 | 4/2013 | Way | |
| 8,666,257 B2 | 3/2014 | Daghighian et al. | |
| 2003/0053768 A1 | 3/2003 | Brezina et al. | |
| 2004/0028164 A1 | 2/2004 | Jiang et al. | |
| 2005/0084269 A1 | 4/2005 | Dallesasse et al. | |
| 2005/0156310 A1 | 7/2005 | Benner et al. | |
| 2008/0095541 A1 | 4/2008 | Dallesasse | |
| 2008/0107422 A1 | 5/2008 | Cole | |
| 2008/0205437 A1 | 8/2008 | Cole | |
| 2008/0240648 A1 | 10/2008 | Im | |
| 2008/0292322 A1 | 11/2008 | Daghighian et al. | |
| 2009/0317086 A1 | 12/2009 | Morohashi et al. | |
| 2010/0008679 A1 | 1/2010 | Cole et al. | |
| 2010/0021166 A1 | 1/2010 | Way | |
| 2010/0266236 A1 | 10/2010 | Meadowcroft et al. | |
| 2010/0272440 A1 | 10/2010 | Haran et al. | |
| 2010/0284698 A1 | 11/2010 | McColloch | |
| 2010/0303423 A1 | 12/2010 | McColloch | |
| 2011/0026888 A1 | 2/2011 | Nekado et al. | |
| 2011/0195589 A1 | 8/2011 | Takahashi | |
| 2012/0170927 A1 | 7/2012 | Huang et al. | |
| 2013/0259478 A1 | 10/2013 | Komaki | |
| 2013/0287394 A1 | 10/2013 | Chaahoub et al. | |
| 2014/0010546 A1 | 1/2014 | Chaahoub et al. | |

OTHER PUBLICATIONS

Dove, Dan et al., "Next Generation 100 Gigabit Optical Ethernet", *Powerpoint Presentation*, IEEE, San Francisco, United States Jul. 2011, 1033.

Gabriel, Steve et al., "Gennum and Altera Demonstrate 4x25Gb/s ICs for Next-Generation 100Gb/s Networks", Press Release, Altera Corporation, San Jose, United States Sep. 19, 2011, 1.

Harpinder, S. Matharu , "100G Dual Gearbox: Improving Port Density on Line Cards in Core Network Equipment", *White Paper: Virtex-7 HT FPGAs*, vol. 1, Xilinx, San Jose, United States Mar. 1, 2012, 1-10.

"FCI MEG-Array Connectors Perform up to 28Gbps for Next-Generation Pluggable Optical Receivers, Press Release, FCI", Apr. 11, 2012.

Chen Ji, Jingyi Wang et al., "High Volume 850nm Oxide VCSEL Develoment for High Bandwidth Optical Data Link Appications, Article", *Society of Photo-Optical Instrumentation Engineers* 2009, 1-11, vol. 7229.

Christian Kromer, Gion Sialm, Christoph Berger, Thomas Morf, Martin L. Schmatz, Frank Ellinger, Daniel Erni, Gian-Luca Bona, Heinz Jackel; A 100-mW 4 x 10 Gb/s Transceiver in 80-nm CMOS for High-Density Optical Interconnects; IEEE Journal of Solid-State Circuits; Dec. 2005; 2667-2679; vol. 40 No. 12; IEEE, United States.

METHOD AND APPARATUS FOR PERFORMING DATA RATE CONVERSION AND PHASE ALIGNMENT

TECHNICAL FIELD OF THE INVENTION

The invention relates to optical communications networks over which data is communicated in the form of optical signals transmitted and received over optical waveguides.

BACKGROUND OF THE INVENTION

In optical communications networks, optical transceiver modules are used to transmit and receive optical signals over optical fibers. An optical transceiver module generates modulated optical signals that represent data, which are then transmitted over an optical fiber coupled to the transceiver module. Each transceiver module includes a transmitter side and a receiver side. On the transmitter side, a laser light source generates laser light and an optical coupling system receives the laser light and optically couples the light onto an end of an optical fiber. The laser light source typically is made up of one or more laser diodes that generate light of a particular wavelength or wavelength range. The optical coupling system typically includes one or more reflective elements, one or more refractive elements and/or one or more diffractive elements. On the receiver side, a photodiode detects an optical data signal transmitted over an optical fiber and converts the optical data signal into an electrical signal, which is then amplified and processed by electrical circuitry of the receiver side to recover the data. The combination of the optical transceiver modules connected on each end of the optical fiber and the optical fiber itself is commonly referred to as an optical fiber link.

In switching systems that are commonly used in optical communications networks, each optical transceiver module is typically mounted on a circuit board that is interconnected with another circuit board that is part of a backplane of the switching system. The backplane typically includes many circuit boards that are electrically interconnected with one another. In many such switching systems, each circuit board of the backplane has an application specific integrated circuit (ASIC) mounted on it and electrically connected to it. Each ASIC is electrically interconnected with a respective optical transceiver module via electrically-conductive traces of the respective circuit boards. In the transmit direction, each ASIC communicates electrical data signals to its respective optical transceiver module, which then converts the electrical data signals into respective optical data signals for transmission over the optical fibers that are connected to the optical transceiver module. In the receive direction, the optical transceiver module receives optical data signals coupled into the module from respective optical fibers connected to the module and converts the respective optical data signals into respective electrical data signals. The electrical data signals are then output from the module and are received at respective inputs of the ASIC, which then processes the electrical data signals. The electrical interconnections on the circuit boards that connect inputs and outputs of each ASIC to outputs and inputs, respectively, of each respective optical transceiver module are typically referred to as lanes.

Figure 1:
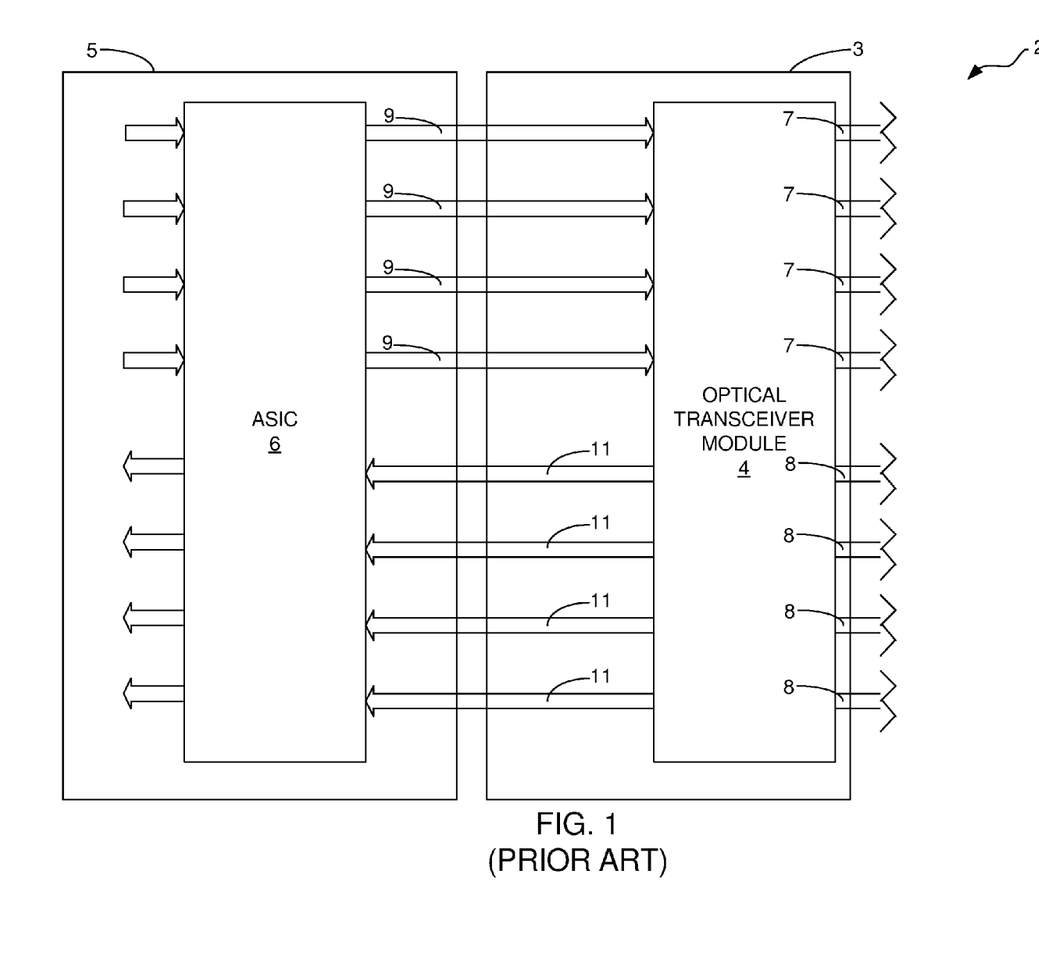
FIG. 1 illustrates a block diagram of a known optical communications system of a known switching system.

FIG. 1 illustrates a block diagram of a known optical communications system 2 of a known switching system. The optical communications system 2 comprises a first circuit board 3, an optical transceiver module 4 mounted on the first circuit board 3, a backplane circuit board 5, and an ASIC 6 mounted on the backplane circuit board 5. Four output optical fibers 7 and four input optical fibers 8 are connected to the optical transceiver module 4. In the transmit direction, the ASIC 6 produces four 10 gigabit per second (Gbps) electrical data signals, which are output from the ASIC 6 onto four respective output lanes 9 to the optical transceiver module 4. The optical transceiver module 4 then converts the four 10 Gbps electrical data signals into four respective 10 Gbps optical data signals and couples them into the ends of four respective optical fibers 7 for transmission over the optical fiber link. In the receive direction, four 10 Gbps optical data signals are coupled from the ends of four respective optical fibers 8 into the optical transceiver module 4, which then converts the optical data signals into four 10 Gbps electrical data signals. The four 10 Gbps electrical data signals are then output over four respective input lanes 11 to four respective inputs of the ASIC 6 for processing by the ASIC 6. Thus, the optical fiber link has a data rate of 40 Gbps in the transmit direction and 40 Gbps in the receive direction. The data rate of the optical fiber link can be increased by increasing the number of optical transceiver modules 4 and ASICs 6 that are included in the link. For example, if four optical transceiver modules 4 and four ASICs 6 are included in the optical communications system 2, the optical fiber link will have a data rate of 160 Gbps in the transmit direction and 160 Gbps in the receive direction.

Ever-increasing demands for greater bandwidth often lead to efforts to upgrade optical fiber links to achieve higher data rates. Doing so, however, typically requires either duplicating the number of optical transceiver modules and ASICs that are used in the optical communications system or replacing the optical transceiver modules and ASICs with optical transceivers and ASICs that operate at higher data rates. Of course, duplicating the number of optical transceiver modules and ASICs that are used in the optical communications system is a very costly solution. Therefore, it would be desirable to provide a way to substantially increase the bandwidth of an optical fiber link without having to duplicate the number of optical transceiver modules and ASICs that are employed in the optical communications system. In order to replace the ASICs with ASICs that operate at higher data rates, the ASIC would have to be redesigned, which is also a very costly solution.

Accordingly, it would be desirable to provide a way to upgrade an optical fiber link to achieve substantially higher data rates without having to duplicate the number of optical transceiver modules and ASICs that are employed in the optical communications system and without having to redesign the ASIC.

SUMMARY OF THE INVENTION

The invention is directed to method and apparatus for performing data rate conversion and phase alignment. The apparatus comprises a gearbox integrated circuit comprising first and second electrical interfaces, phase-alignment circuitry, first rate conversion circuitry, and second rate conversion circuitry. The first electrical interface has N input terminals for inputting N electrical data signals having a data rate of X Gbps and N output terminals for outputting N electrical data signals having a data rate of X Gbps, where N is a positive integer that is equal to or greater than two and X as a positive number that is equal to or greater than one. The phase-alignment circuitry phase-aligns pairs of the N inputted electrical data signals to produce N/2 pairs of phase-aligned electrical data signals. The first rate conversion circuitry receives the N/2 phase-aligned pairs of electrical data signals and converts each phase-aligned pairs into a serialized electrical data signal having a data rate of 2 Gbps. The second electrical interface has N/2 output terminals and N/2 input terminals. The serialized 2X Gbps electrical data signals are outputted from the gearbox IC via the N/2 output terminals of the second electrical interface. The second rate conversion circuitry receives N/2 2X Gbps electrical data signals inputted to the gearbox IC via the N/2 input terminals of the second electrical interface and converts them into N electrical data signals having a data rate of X Gbps. The N X Gbps electrical data signals are then outputted from the gearbox IC via the N output terminals of the first electrical interface.

The method comprises:

in a first electrical interface of the gearbox IC having N input terminals and N output terminals, inputting N electrical data signals having a data rate of X Gbps;

in phase-alignment circuitry of the gearbox IC, phase-aligning pairs of the N inputted electrical data signals to produce N/2 pairs of phase-aligned electrical data signals;

in first rate conversion circuitry of the gearbox IC, receiving the N/2 phase-aligned pairs of electrical data signals from the phase-alignment circuitry and converting each of the N/2 phase-aligned pairs into a serialized electrical data signal having a data rate of 2 Gbps;

from a second electrical interface of the gearbox IC having N/2 output terminals and N/2 input terminals, outputting the serialized 2X Gbps electrical data signals from the gearbox IC via the N/2 output terminals of the second electrical interface; and in second rate conversion circuitry of the gearbox IC, receiving N/2 2X Gbps electrical data signals inputted to the gearbox IC via the N/2 input terminals of the second electrical interface, converting the N/2 2X Gbps electrical data signals into N X Gbps electrical data signals having a data rate of X Gbps, and outputting the N X Gbps electrical data signals from the gearbox IC via the N output terminals of the first electrical interface.

These and other features and advantages of the invention will become apparent from the following description, drawings and claims.

DETAILED DESCRIPTION OF AN ILLUSTRATIVE EMBODIMENT

In accordance with the invention, a gearbox that is compatible with current ASIC designs currently used in optical fiber links is incorporated into an optical communications system to achieve a high-speed optical fiber link that at least doubles the data rate of the aforementioned known optical fiber link. Thus, the data rate of the optical fiber link is dramatically increased without requiring a redesign of the ASIC that is currently used in the optical fiber link. The gearbox IC is configured to interface with multiple ASICs of the current ASIC design and to interface with a high-speed optical transceiver module.

In the transmit direction, the gearbox IC receives N lanes of electrical data signals from the ASICs, with each electrical data signal having a data rate of X Gbps, and outputs N/2 lanes of electrical data signals, with each electrical data signal having a data rate of 2X Gbps, where N is a positive integer that is equal to or greater than 2 and X is a positive number that is equal to or greater than 1. The high-speed optical transceiver module receives the N/2 electrical data signals output from the gearbox IC, produces N/2 respective optical data signals and outputs the optical data signals onto N/2 optical fibers, with each optical data signal having a data rate of 2X.

In the receive direction, the high-speed optical transceiver module receives N/2 optical data signals over N/2 optical fibers and converts them into N/2 respective electrical data signals, each having a data rate of 2X Gbps. The N/2 electrical data signals are then received over N/2 lanes at respective inputs of the gearbox IC, which converts the N/2 electrical data signals into N electrical data signals, each having a data rate of X. The gearbox IC then outputs the N electrical data signals onto N lanes for delivery to respective inputs of the ASICs. The ASICs then process the electrical data signals in the normal manner.

For example, if the total number of data lanes that are output from all of the ASICs is equal to four (i.e., N=4), with each electrical data signal having a data rate of 10.3125 Gbps (i.e., X=10), then the gearbox IC will output two lanes of electrical data signals, with each electrical data signal having a data rate of 20.625 Gbps. As is typical in the optical communications industry, a data rate of 10.3125 Gbps will be referred to herein as simply 10 Gbps and the data rate of 20.625 Gbps will be referred to herein simply as 20 Gbps. The high-speed optical transceiver module converts each electrical data signal into an optical data signal at the same data rate as the electrical data signal and outputs the optical data signal onto an optical fiber. In the receive direction, the optical transceiver module receives two optical data signals, each having a data rate of 20 Gbps, and converts them into two electrical data signals, each having a data rate of 20 Gbps. The optical data signals are the delivered over two lanes to the gearbox IC, which converts them into four electrical data signals, each having a data rate of 10 Gbps. The four 10 Gbps electrical data signals are then delivered over four respective lanes to the ASICs, which process the electrical data signals in the normal manner.

Thus, incorporation of the gearbox IC into the optical communications system allows ASICs of an existing design to be used with a high-speed optical transceiver module to achieve a data rate for the optical fiber link that is at least double the previous data rate of the link. These and other features and advantages of the invention will now be described with reference to the illustrative, or exemplary, embodiments shown in FIGS. 2-8, in which like reference numerals represent like elements or features.

Figure 2:
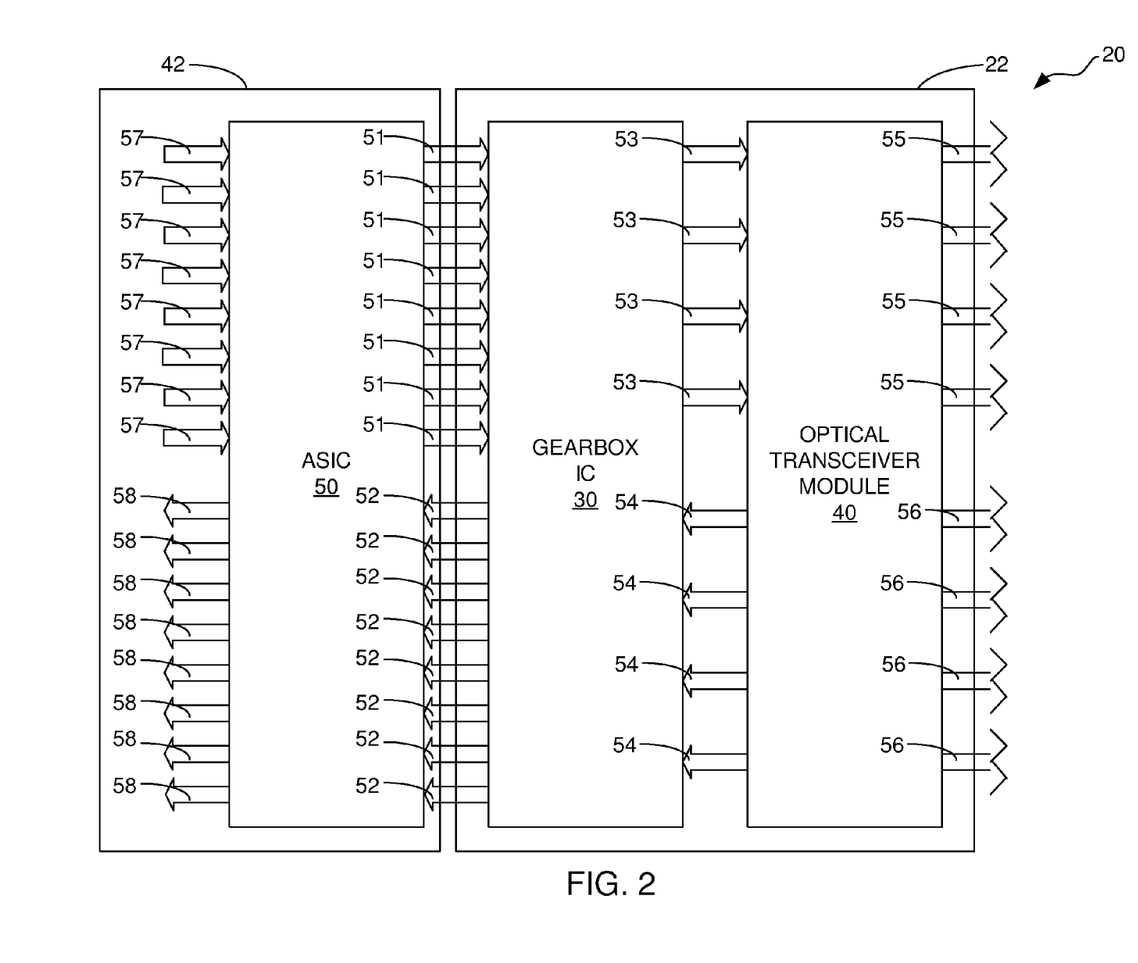
FIG. 2 illustrates a block diagram of an optical communications system located on one end of the high-speed optical fiber link in accordance with one illustrative, or exemplary, embodiment of the invention.

FIG. 2 illustrates a block diagram of an optical communications system 20 located on one end of the high-speed optical fiber link in accordance with one illustrative, or exemplary, embodiment of the invention. The optical communications system 20 comprises a first circuit board 22, a gearbox IC 30 mounted on the first circuit board 22, a high-speed optical transceiver module 40 mounted on the first circuit board 22, a backplane circuit board 42, and one or more ASICs 50 mounted on the backplane circuit board 42. In accordance with this illustrative embodiment, the one or more ASICs 50 corresponds to two of the ASICs 6 shown in FIG. 1, although the one or more ASICs 50 could be a single ASIC. For ease of illustration, the one or more ASICs 50 are represented as a single block in the block diagram of FIG. 2. It should also be noted that although two separate circuit boards 22 and 42 are shown in FIG. 2, the gearbox IC 30, the high-speed optical transceiver module 40 and the ASIC 50 could be mounted on a single circuit board, such as circuit board 22.

In accordance with the illustrative embodiment shown in FIG. 2, N=8 and X=10 Gbps. Therefore, there are eight output lanes 51 interconnecting the ASIC 50 and the gearbox IC 30 and eight input lanes 52 interconnecting the ASIC 50 and the gearbox IC 30. There are four output lanes 53 interconnecting the gearbox IC 30 and the optical transceiver module 40 and four input lanes 54 interconnecting the optical transceiver module 40 and the gearbox IC 30. There are four output optical fibers 55 and four input optical fibers 56 optically and mechanically coupled to the optical transceiver module 40. In the transmit direction, eight 10 Gbps electrical data signals are output on the output lanes 51 from the ASIC 50 to the gearbox IC 30. The gearbox IC converts the eight 10 Gbps electrical data signals into four 20 Gbps electrical data signals and outputs the four 20 Gbps electrical data signals onto output lanes 53 to the optical transceiver module 40.

The optical transceiver module 40 converts each 20 Gbps electrical data signal into a 20 Gbps optical data signal and outputs the optical data signals onto output optical fibers 55. In the receive direction, the optical transceiver module 40 receives four 20 Gbps optical data signals output from the ends of the four input optical fibers 56 and converts them into four 20 Gbps electrical data signals. The four 20 Gbps optical data signals are then delivered over the four input lanes 54 to the gearbox IC 30, which converts the four 20 Gbps electrical data signals into eight 10 Gbps electrical data signals. The eight 10 Gbps electrical data signals are then delivered over the eight input lanes 52 to the ASIC 50, which processes the 10 Gbps electrical data signals in the known manner in which the ASIC 6 shown in FIG. 1 processes 10 Gbps electrical data signals.

On the backplane side of the ASIC 50, there are typically eight 10 Gbps input lanes 57 and eight 10 Gbps output lanes 58 for communicating with other ASICs 50 and/or other gearbox ICs 30 of other optical communications systems that are identical to optical communications system 20 and located either within the same switching system or in other switching systems. Furthermore, another instance of the gearbox IC 30 may be added to the backplane side to double the data rate of the electrical data signals that are communicated between ASICs 50 of the backplane, as will now be described with reference to FIG. 3.

Figure 3:
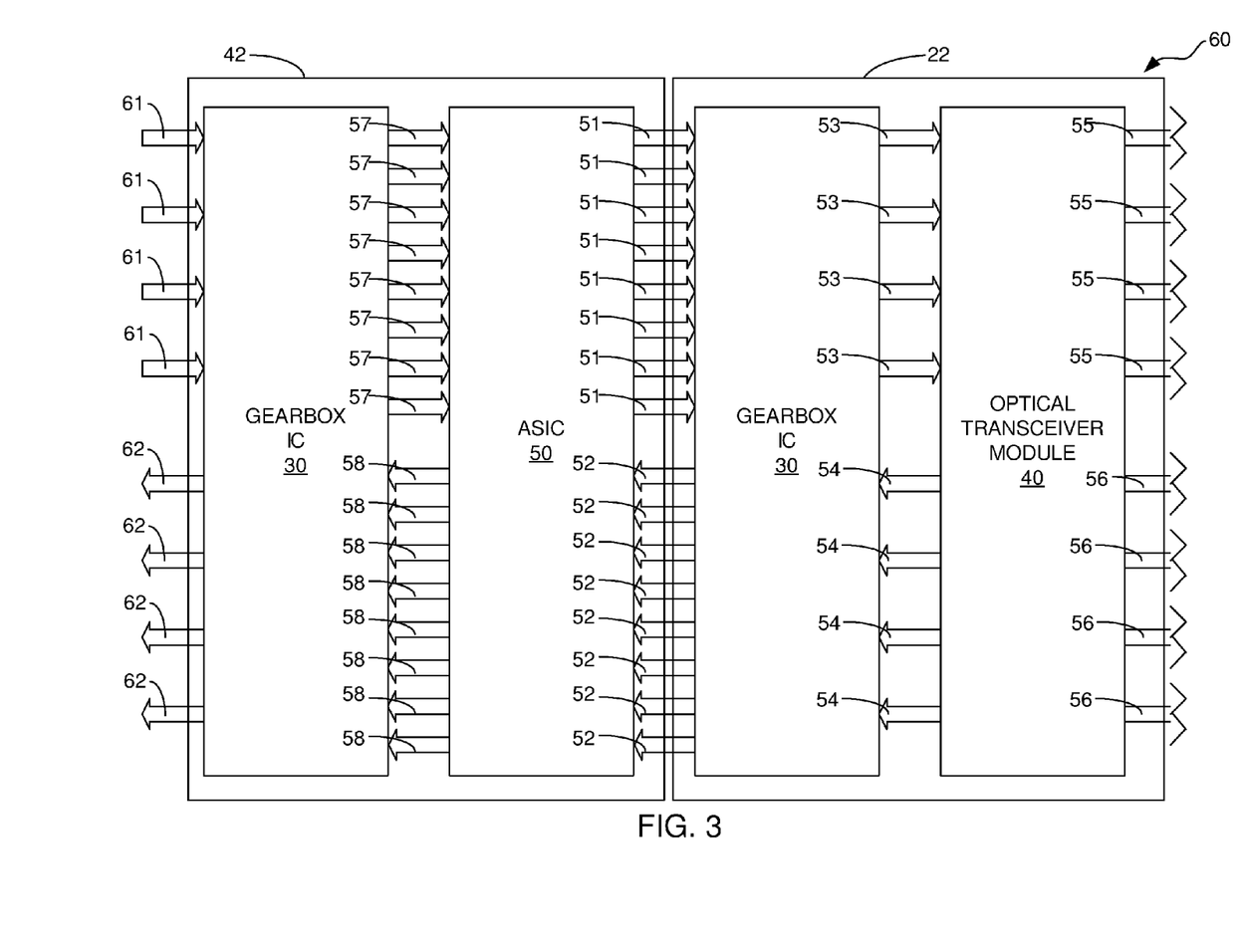
FIG. 3 illustrates a block diagram of an optical communications system that is identical to the optical communications system shown in FIG. 2 except that the optical communications system includes a second gearbox IC that is interconnected with the ASIC on the backplane side of the system.

FIG. 3 illustrates a block diagram of an optical communications system 60 that is identical to the optical communications system 20 shown in FIG. 2 except that the optical communications system 60 includes a second gearbox IC 30 that is interconnected with the ASIC 50 on the backplane side of the system 60. The second gearbox IC 30 receives four 20 Gbps electrical data signals over four input lanes 61 and outputs four 20 Gbps electrical data signals over four output lanes 62. The four 20 Gbps electrical data signals that are received in the gearbox IC 30 over input lanes 61 are output from an identical gearbox IC 30 of an identical optical communication system 60 located elsewhere in the same switching system. Similarly, the four 20 Gbps electrical data signals that are output from the gearbox IC 30 over output lanes 62 are input to an identical gearbox IC 30 of an identical optical communication system 60 located elsewhere in the same switching system. In this way, the gearbox ICs 30 allow ASICs 50 of the same switching system or of different, but similarly configured, switching systems to communicate with one another at the higher data rate of 20 Gbps instead of 10 Gbps.

Figure 4:
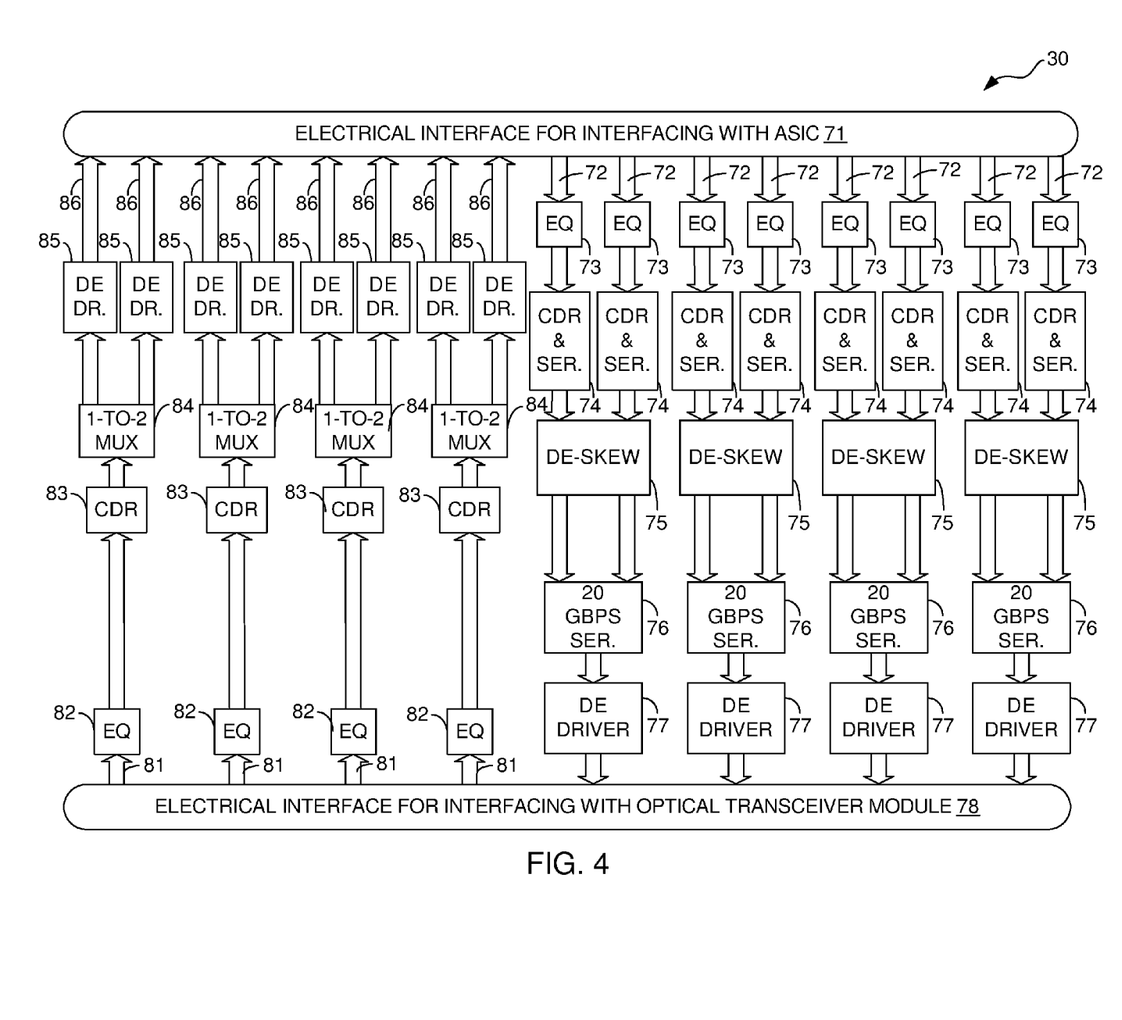
FIG. 4 illustrates a block diagram of the gearbox IC shown in FIG. 2 in accordance with an illustrative embodiment.

FIG. 4 illustrates a block diagram of the gearbox IC 30 shown in FIG. 2 in accordance with an illustrative embodiment. In the illustrative embodiments described above with reference to FIGS. 2 and 3, the gearbox IC 30 has been described in terms of simply performing rate conversion, but to accomplish the rate conversion, the gearbox IC 30 performs additional operations, such as, for example, clock and data recovery (CDR), bit alignment, serialization, and demultiplexing. The components of the gearbox IC 30 and the operations they perform will now be described with reference to FIG. 4.

An electrical interface 71 interfaces the gearbox IC 30 with the ASIC 50. The electrical interface 71 may be, for example, an XLAUI interface, which is a well-known interface for interfacing ICs. For the incoming 10 Gbps electrical data signals received over lanes 51 from the ASIC 50, four pairs of lanes 72 that are internal to the gearbox IC 30 provide the electrical data signals to respective equalizers 73. The equalizers 73 restore the respective electrical data signals to their original waveforms and output each pair of the restored electrical data signals to respective CDR and deserializer components 74. The CDR and deserializer components 74 perform clock and data recovery and deserialization on each of the electrical data signals of the respective pairs and output the resulting pairs of electrical data signals to respective de-skew components 75. The de-skew components 75 performs static and dynamic phase alignment on the respective pairs of electrical data signals and provide the pairs of phase-aligned electrical data signals to respective 20 Gbps serializer components 76.

The 20 Gbps serializer components 76 perform serialization on the two phase-aligned electrical data signals of the respective pairs to produce respective 20 Gbps electrical data signals. The four 20 Gbps electrical data signals are then delivered to respective de-emphasis (DE) drivers 77, which de-emphasize and amplify the respective 20 Gbps electrical data signals and deliver the respective 20 Gbps electrical data signals to electrical interface 78. The electrical interface 78 is a physical layer/media access layer device (PMD) configured to interface the gearbox IC 30 with the optical transceiver module 40 (FIG. 2). The resulting 20 Gbps electrical data signals are then delivered to the optical transceiver module 40, which converts them into 20 Gbps optical data signals and couples the optical data signals onto respective optical fibers 55 (FIG. 2). Embodiments of the optical transceiver module 40 will be described below detail with reference to FIGS. 7 and 8.

In the receive direction, the electrical interface 78 receives four 20 Gbps electrical data signals from the optical transceiver module 40 (FIG. 2) and delivers them via respective internal lanes 81 to respective equalizers 82. The equalizers 82 perform equalization on the respective 20 Gbps electrical data signals and deliver the equalized electrical data signals to respective CDR components 83. The CDR components 83 perform clock and data recovery algorithms on the respective electrical data signals and deliver pairs of the respective 20 Gbps electrical data signals to respective 1-to-2 multiplexers (MUXes) 84. Each of the MUXes 84 converts a respective 20 Gbps electrical data signal into a pair of 10 Gbps electrical data signals, which are then delivered to respective DE drivers 85. The DE drivers 85 de-emphasize and amplify the respective 10 Gbps electrical data signals and output the respective 10 Gbps electrical data signals onto internal lanes 86 for delivery to the electrical interface 71. The electrical interface 71 then outputs the eight 10 Gbps electrical data signals over lanes 52 (FIG. 2) to the ASIC 50 (FIG. 4).

It should be noted that many modifications may be made to the gearbox IC 30 shown in FIG. 2 while still allowing the gearbox IC 30 to perform the tasks described above of converting pairs of 10 Gbps electrical data signals into 20 Gbps electrical data signals, and vice versa. For example, the equalizers 73 and 82 and the de-emphasis drivers 77 and 85 are optional in many cases depending on the trace lengths that carry the corresponding electrical data signals and the strength or integrity of the corresponding electrical data signals. It should also be noted that other variations may be made to the gearbox IC 30, such as replacing certain components that perform certain functions with other components that perform similar or equivalent functions. Persons of skill in the art will understand the manner in which such modifications can be made to the gearbox IC 30 while still allowing it to perform the functions described above with reference to FIGS. 2-4.

Figure 5:
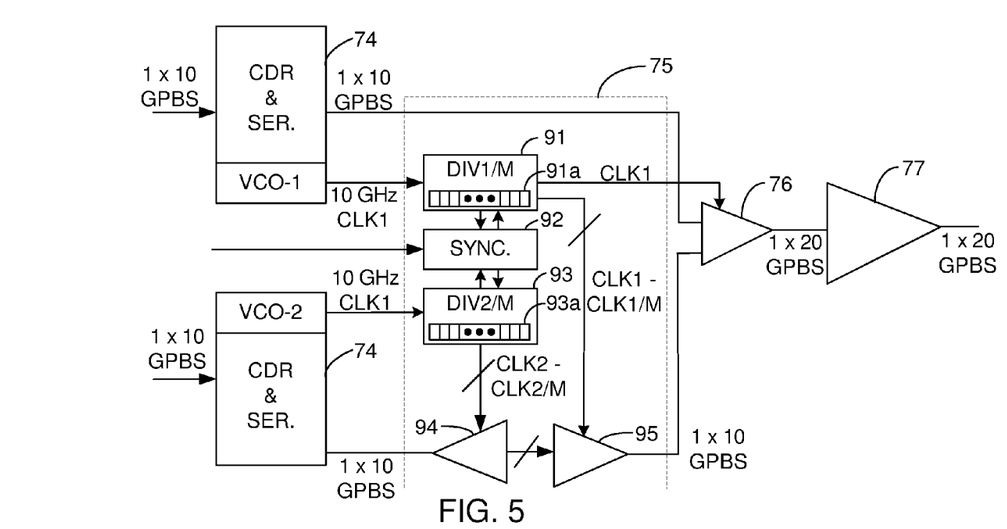
FIG. 5 illustrates a block diagram of a portion of the gearbox IC shown in FIG. 4.
Figure 6:
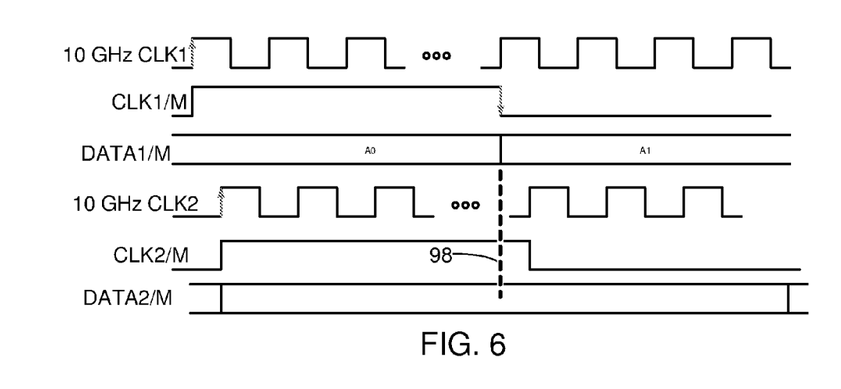
FIG. 6 illustrates a timing diagram that demonstrates the timing of the portion of the gearbox IC shown in FIG. 5.

FIG. 5 illustrates a block diagram of a portion of the gearbox IC shown in FIG. 4 corresponding to a pair of the CDR and deserializer components 74, a respective de-skew component 75, a respective 20 Gbps serializer 76, and a respective DE driver 77. FIG. 6 illustrates a timing diagram that demonstrates the timing of the portion of the gearbox IC shown in FIG. 5. As indicated above with reference to FIG. 4, the CDR and serializer components 74 perform clock and data recovery and serialization on each of the electrical data signals of the respective pairs and output the resulting pairs of electrical data signals to respective de-skew components 75. The respective de-skew component 75 performs phase alignment on the respective pair of 10 Gbps electrical data signals and provides the phase-aligned pair of electrical data signals to the respective 20 Gbps serializer component 76. The 20 Gbps serializer component 76 performs serialization on the two phase-aligned 10 Gbps electrical data signals of the respective pairs to produce a single 20 Gbps electrical data signal. The respective DE driver 77 de-emphasizes and amplifies the 20 Gbps electrical data signal and delivers it to the electrical interface 78 (not shown in FIG. 5). A more detailed description of these components and the processes they perform will now be provided with reference to FIGS. 5 and 6.

When the two 10 Gbps electrical data signals are received in the respective CDR & serializer components 74a and 74b, it is unlikely that there phases will be aligned. The timing diagram shows a first waveform labeled 10 GHz CLK1 corresponding to the clock signal that is recovered from the 10 Gbps data stream received in the CDR & Serializer component 74a. The timing diagram shows a second waveform labeled 10 GHz CLK2 corresponding to the clock signal that is recovered from the 10 Gbps data stream received in the CDR & Serializer component 74b. VCO-1 of CDR & serializer component 74a locks onto the rising edge of the 10 Gbps electrical data signal and generates a 10 Gigahertz (GHz) clock signal, labeled 10 GHz CLK1, that is aligned with the rising edge of the 10 Gbps electrical data signal. Likewise, VCO-2 of CDR & serializer component 74b generates a 10 Gigahertz (GHz) clock signal, labeled 10 GHZ CLK2, that is aligned with the rising edge of the 10 Gbps electrical data signal received at the input of component 74b. Because the 10 Gbps electrical data signals received at the inputs of components 74a and 74b likely will not be in perfect phase alignment, the timing diagram of FIG. 6 shows these clock signals as not being phase-aligned for demonstrative purposes.

The purpose of the De-skew component 75 is to phase-align the two 10 Gbps electrical data signals received in the two CDR & serializer components 74a and 74b. The elements shown in the dashed box 75 in FIG. 5 represent the elements of the De-skew component 75 shown in FIG. 4. Components 74a, 74b and 75 together comprise phase-alignment circuitry. These components operate in conjunction with one another to perform the phase-alignment task, as will now be described with reference to FIGS. 5 and 6. A first divider 91, labeled DIV1-M, receives the 10 GHz clock signal, CLK1, from VCO-1 and divides it by 2 thru M, where M is an integer that is greater than or equal to 2 and that corresponds to the number of bits that make up a word in the 10 Gbps electrical data signal stream. The value of M will typically be 16 or 32, but could be any value. By dividing clock signal CLK1 by 2 thru M, the first divider 91 generates clock signals CLK1/2, CLK1/3, CLK1/4 . . . CLK1/M. Thus, for example, clock signal CLK1/2 has a frequency that is one-half the frequency of CLK1 and clock signal CLK1/M has a frequency that is 1/Mth the frequency of clock signal CLK1.

A second divider 93, labeled DIV2-M, receives the 10 GHz clock signal, CLK2, from VCO-2 and divides it by 2 thru M to generate clock signals CLK2/2, CLK2/3, CLK2/4 . . . CLK2/M. Thus, for example, clock signal CLK2/2 has a frequency that is one-half the frequency of CLK2 and clock signal CLK2/M has a frequency that is 1/Mth the frequency of clock signal CLK2. Only clock signals CLK1, CLK2, CLK1/M and CLK2/M are shown in the timing diagram of FIG. 6. It can be seen in the timing diagram that the rising edge of clock signal CLK1/M is aligned with the rising edge of clock signal CLK1 at the beginning of each clock cycle of clock signal CLK1/M Likewise, the rising edge of clock signal CLK2/M is aligned with the rising edge of clock signal CLK2 at the beginning of each clock cycle of clock signal CLK2/M. The rising edges of clock signals CLK1/2-CLK1/M−1 are aligned with the rising edge of clock signal CLK1 at the beginning of each clock cycle of clock signals CLK1/2-CLK1/M−1, respectively. The rising edges of clock signals CLK2/2-CLK2/M−1 are aligned with the rising edge of clock signal CLK2 at the beginning of each clock cycle of clock signals CLK2/2-CLK2/M−1, respectively.

The first and second dividers 91 and 93 have counters 91a and 93a, respectively, inside of them that count from zero to M−1. The counter 91a is incremented on the rising edge of clock CLK1 and the counter 93a is incremented on the rising edge of clock CLK2, although the counters could instead be configured to increment on the falling edges of the respective clock signals. Once the counter 91a has reached the value of M−1, the divider 91 transitions the clock signal CLK1/M from a logic one value to a logic zero value on the next rising edge of clock signal CLK1. Likewise, once the counter 93a has reached the value of M−1, the counter 93a transitions the clock signal CLK2/M from a logic one value to a logic zero value on the next rising edge of clock signal CLK2.

Element 92 is a synchronization monitor that monitors the phase misalignment of the clocks CLK1/M and CLK2/M and that simultaneously resets the counters 91a and 93a to zero. In this way, the clock signals CLK1/2-CLK1/M and CLK2/2-CLK2/M, respectively, are placed in alignment with one another and kept in alignment with one another. Once the clock signals CLK1/M and CLK2/M have transitioned from a logic one value to a logic zero value, those clock signals remain in the logic zero state during the time period that the counters 91a and 93a are incremented again from zero to M−1. After the counters 91a and 93a have reached the value of M−1, the dividers 91 and 93 transition the clock signals CLK1/M and CLK2/M from a logic zero value to a logic one value on the next rising edge of clock signals CLK1 and CLK2, respectively. The synchronization monitor 92 then simultaneously resets the counters 91a and 93a to zero, which ensures that the falling edges of the clock signals CLK1/M and CLK2/M are kept in alignment. Clock signals CLK1/2 thru CLK1/M−1 and CLK2/2 thru CLK2/M−1 are triggered based on the values of the counters 91a and 93a, which ensures that remain properly aligned.

Element 94 is a 1-to-M demultiplexer (DeMUX) and element 95 is an M-to-1 multiplex (MUX). The DeMUX 94 receives the 10 Gbps electrical data signal that is received at the input of CDR & serializer 74b. The DeMUX 94 also receives the clock signals CLK2, CLK2/2, CLK2/3, etc., thru CLK2/M. On the rising and falling edges of clock signals CLK2 thru CLK2/M, the DeMUX 94 outputs one of the M bits of the 10 Gbps electrical data signal such that by the end of a clock cycle of CLK2/M, M bits are ready to be delivered in parallel to the MUX 95. On the next rising edge of clock signal CLK2, the M bits are delivered in parallel to the MUX 95. The waveform corresponding to the output from the DeMUX 94 is labeled DATA2/M in FIG. 6.

The MUX 95 receives clock signals CLK1, CLK1/2, CLK1/3, etc., thru CLK1/M and outputs one of the M bits from the MUX 95 on the rising and falling edge of a respective one of these clock signals such that by the end of a clock cycle CLK1/M, the M bits are ready to be output serially from the MUX 95. On each falling edge of clock signal CLK1, the MUX 95 outputs one of the M bits such that a serial bit stream at a data rate of 10 Gbps is output from the MUX 95. The 10 Gbps serial bit stream output from the MUX 95, which is labeled DATA1/M in FIG. 6, is now phase-aligned with the 10 Gbps electrical data signal passed through the CDR and serializer component 74a to the 20 Gbps serializer 76.

The 20 Gbps serializer 76 comprises first rate conversion circuitry for converting the data rate in the transmit direction from 10 Gbps to 20 Gbps. The serializer 76 selects the bit received at one of its inputs on the rising edge of the 10 GHz clock signal CLK1 to be output therefrom and selects the bit received at the other of its inputs on the next falling edge of clock signal CLK1 to be output therefrom. In this way, the serializer 76 converts the two 10 Gbps bit streams received at its inputs into one 20 Gbps bit stream at its output. The DE driver 77 then performs demphasis and amplification of the 20 Gbps electrical data signal, which is then provided to the optical transceiver module 40, as described above with reference to FIGS. 2-4.

The configuration shown in FIG. 5 can tolerate a skew, or phase mismatch, of M/2−1 between the two 10 Gbps electrical data signals received by the CDR & serializer components 74a and 74b. In other words, there can be a maximum allowable phase misalignment between the two 10 Gbps electrical data signals of M/2−1 cycles of the clock signal CLK1. Provided that the amount of phase misalignment is not greater than the maximum allowable phase misalignment, the 20 Gbps electrical data signal output from the 20 Gbps serializer 76 and from the DE driver 77 will have the proper bit values. This is accomplished, in part, by ensuring that the falling edge of clock signal CLK1/M occurs somewhere in the middle of the data signal DATA2/M, as shown in FIG. 6 by the vertical dashed line 98.

As indicated above, the synchronization monitor 92 monitors and compares the values of the counters 91a and 93a. When it makes this comparison, if the count values differ by more than M/2−1, this is an indication that the current amount of phase misalignment is greater than the maximum allowable phase misalignment. If this occurs, the synchronization monitor 92 sends an interrupt to a user interface (not shown) and resets the counters 91a and 93a to zero. The interrupt informs the user that an error has occurred that may require link diagnostic tests to be performed or some other action to be taken.

With reference again to FIG. 4, the logic within the gearbox IC 30 that converts each 20 Gbps electrical data signal output from the optical transceiver module 40 into a pair of 10 Gbps electrical data signals is less complicated than the logic described above with reference to FIG. 5 due to the fact that a de-skew process does not need to be performed on the data moving in this direction. The logic within the gearbox IC 30 that is used for performing the 20-to-10 Gbps rate conversion process is represented by the pairs of CDRs 83 and the 1-to-2 MUXes 84 shown in FIG. 4. Like the CDRs & serializers 74a and 74b shown in FIG. 5, each CDR 83 includes a VCO (not shown) that locks onto the rising edge of the respective 20 Gbps electrical data signal and outputs a 20 GHz clock signal. This 20 GHz clock signal is output to the respective 1-to-2 MUX 84. As the 20 Gbps serial bit stream is received at the input terminal of the respective 1-to-2 MUX 84, it is sampled on both the rising and falling edges of the 20 GHz clock signal such that each successive bit in the bit stream is provided to a different one of the output terminals of the 1-to-2 MUX 84 at a data rate of 10 Gbps.

Figure 7:
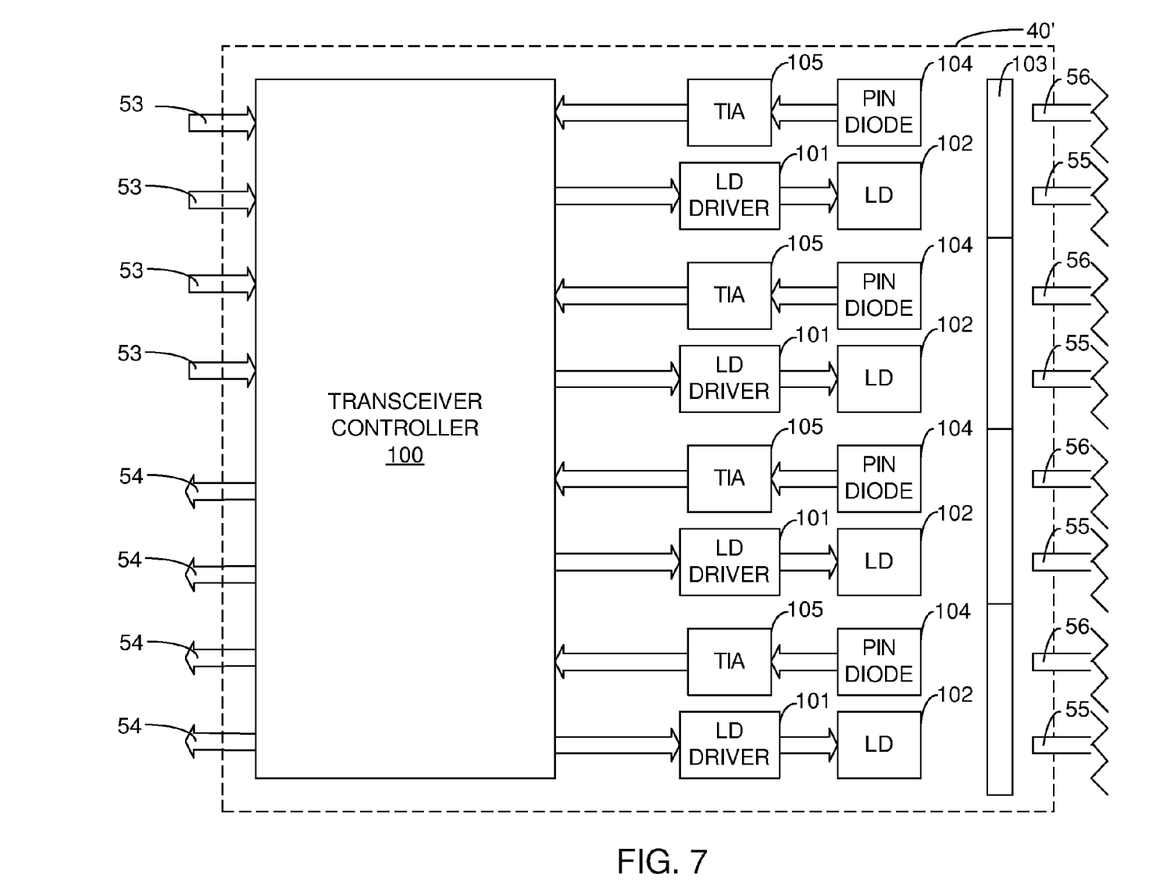
FIG. 7 illustrates a block diagram of the high-speed optical transceiver module shown in FIGS. 2 and 3 in accordance with an illustrative embodiment.

FIG. 7 illustrates a block diagram of the high-speed optical transceiver module 40 shown in FIGS. 2 and 3 in accordance with an illustrative embodiment. The optical transceiver module 40 in accordance with this illustrative embodiment will be referred to herein as optical transceiver module 40'. Four 20 Gbps electrical data signals output from the gearbox IC 30 (FIGS. 2-4) are delivered via lanes 53 to a transceiver controller 100 of the optical transceiver module 40'. The transceiver controller 100 includes a programmable control device (not shown) such as a microcontroller or microprocessor, for example, as well as other electrical circuitry (not shown) for processing the electrical data signals received in the controller 100 via lanes 53 and for processing electrical data signals to be output from the controller onto lanes 54. In the transmit direction, the four 20 Gbps electrical data signals received in the controller 100 on lanes 53 are processed and then delivered to the laser diode (LD) drivers 101. The LD drivers 101 modulate the respective LDs 102 in accordance with the respective 20 Gbps electrical data signals to produce respective 20 Gbps optical data signals. The four 20 Gbps optical data signals produced by the four LDs 102 are then coupled by an optics system 103 into the ends of four respective optical fibers 55 for transmission over the optical fiber link.

In the receive direction, four 20 Gbps optical data signals are output from the ends of four respective optical fibers 56 and are coupled by the optics system 103 onto four photodiodes 104, which convert the optical data signals into respective electrical current signals. The photodiodes 104 may be, for example, p-intrinsic-n (PIN) diodes. The respective electrical current signals are then output to respective trans-impedance amplifiers (TIAs) 105, which convert the electrical current signals into respective 20 Gbps electrical voltage signals. The four 20 Gbps electrical voltage signals are then processed by electrical circuitry (not shown) of the transceiver controller 100, such as a CDR circuitry, to recover the data contained in the electrical voltage signals to produce four 20 Gbps electrical data signals. The four 20 Gbps electrical data signals are then output on lanes 54 for delivery to the gearbox IC 30.

The LDs 102 are not limited to being any particular types of LDs. In accordance with the illustrative embodiment, the LDs 102 are vertical cavity surface emitting laser diodes (VCSELs). The VCSELs that are used for this purpose may operate at data rates of 16 Gbps and still allow the data rate of the optical data signals that are transmitted over the fibers 55 to be 20 Gbps. This is made possible in large part through the pre-conditioning and post-conditioning of the electrical data signals in the gearbox IC 30 and/or in the electrical circuitry of the transceiver controller 100. Of course, VCSELs that operate at even higher data rates, e.g., 20 Gbps, are also suitable for this purpose, but such VCSELs currently may not be widely available.

The optics system 103 may be any type of suitable optics system such as, for example, a refractive or diffractive optics system comprising one or more refractive or diffractive optical elements, respectively. As will be understood by those of skill in the art, a variety of optical elements exist or can readily be designed and manufactured for this purpose. In the illustrative embodiment shown in FIG. 7, a separate optical fiber 55 and 56 is used for each LD 102 and photodiode 104, respectively. As will now be described with reference to FIG. 8, a single optical fiber may be used with each pair of LDs 102 and photodiodes 104 to provide a bidirectional optical fiber link.

Figure 8:
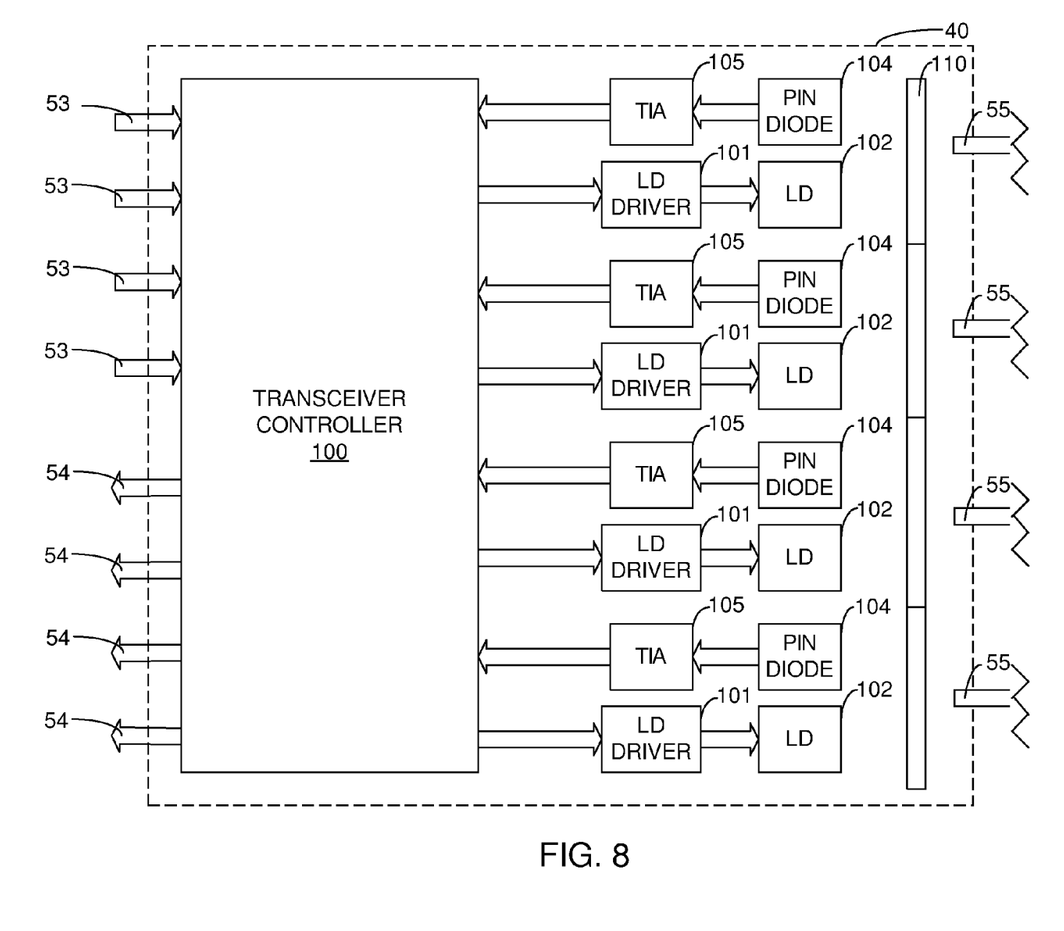
FIG. 8 illustrates a block diagram of the high-speed optical transceiver module shown in FIGS. 2 and 3 in accordance with another illustrative embodiment.

FIG. 8 illustrates a block diagram of the high-speed optical transceiver module 40 shown in FIGS. 2 and 3 in accordance with another illustrative embodiment. The optical transceiver module 40 in accordance with this illustrative embodiment will be referred to herein as optical transceiver module 40". The optical transceiver module 40" is identical to the optical transceiver module 40' shown in FIG. 7 except that the optical transceiver module 40" has an optics system 110 that is different from the optics system 103 shown in FIG. 7, as will be described below in detail. Also, for reasons that will be described below in connection with the optics system 110, the optical transceiver module 40" is connected to only N/2 optical fibers 55 instead of the eight optical fibers 55 and 56 shown in FIG. 7. In accordance with this illustrative embodiment, N=8, and therefore there are a total of four optical fibers 55. Each of the four optical fibers 55 acts as both a transmit optical fiber for transmitting optical data signals over the optical fiber link and as a receive optical fiber for receiving optical data signals over the optical fiber link. Therefore, these optical fibers 55 will be referred to herein as transmit/receive optical fibers. Like reference numerals in FIGS. 5 and 6 represent like elements or components.

In the transmit direction, four 20 Gbps electrical data signals output from the gearbox IC 30 (FIGS. 2-4) are delivered via lanes 53 to the transceiver controller 100 of the optical transceiver module 40". As stated above, the transceiver controller 100 includes a programmable control device (not shown) such as a microcontroller or microprocessor, for example, as well as other electrical circuitry (not shown) for pre-processing of the electrical data signals that are received in the controller 100 via lanes 53 and for post-processing of the electrical data signals that are to be output from the controller 100 onto lanes 54. The four 20 Gbps electrical data signals received in the controller 100 on lanes 53 are processed and then delivered to the LD drivers 101. The LD drivers 101 modulate the respective LDs 102 in accordance with the respective 20 Gbps electrical data signals received thereby to produce respective 20 Gbps optical data signals. The four 20 Gbps optical data signals produced by the four LDs 102 are then coupled by the optics system 110 into the ends of four respective transmit/receive optical fibers 55 for transmission over the optical fiber link.

In the receive direction, four 20 Gbps optical data signals are output from the ends of the four respective transmit/receive optical fibers 55 and are coupled onto the four respective PIN diodes 104, which convert the optical data signals into respective electrical current signals. The respective electrical current signals are then output to the respective TIAs 105, which convert the electrical current signals into respective 20 Gbps electrical voltage signals. The four 20 Gbps electrical voltage signals are then processed by electrical circuitry (not shown) of the transceiver controller 100, such as a CDR circuitry, to recover the data contained in the electrical voltage signals to produce four 20 Gbps electrical data signals. The four 20 Gbps electrical data signals are then output on lanes 54 for delivery to the gearbox IC 30.

In accordance with the illustrative embodiment shown in FIG. 8, the optics system 110 performs optical MUXing and DeMUXing operations to allow optical data signals to be simultaneously transmitted and received over optical fibers 55 such that full optical duplexing is achieved over the optical fiber link. In other words, optical data signals are simultaneously transmitted and received on each of the optical fibers 55 at a data rate of at least 20 Gbps in each direction. Therefore, the optical fiber link is capable of simultaneously transmitting optical data signals at a data rate of 80 Gbps and receiving optical data signals at a data rate of 80 Gbps to provide an aggregate data rate for the optical fiber link of 160 Gbps using only four optical fibers 55. The manner in which such a full-duplex optical fiber link can be provided is disclosed in U.S. patent application Ser. No. 12/495,707, filed on Jun. 30, 2009, entitled "A HIGH-SPEED OPTICAL TRANSCEIVER, A BI-DIRECTIONAL DUPLEX OPTICAL FIBER LINK, AND A METHOD FOR PROVIDING A BI-DIRECTIONAL DUPLEX OPTICAL FIBER LINK," which has been published as U.S. Publ. Appl. No. 2010/0329669, and which is incorporated by reference herein in its entirety. Therefore, in the interest of brevity, the optics system 110 and the optical MUXing and deMUXing operations performed thereby will not be described herein in further detail.

The above description of FIGS. 2-6 has demonstrated illustrative embodiments of the invention that enable the data rate of an optical fiber link to be substantially increased (e.g., doubled) without having to redesign the ASICs that are used in the backplanes of the link. In the illustrative embodiments described above, a 20 Gbps optical transceiver module is used in conjunction with an ASIC that inputs and outputs 10 Gbps electrical data signals and with a gearbox IC that converts 10 Gbps electrical data signals into 20 Gbps electrical data signals, and vice versa, to upgrade an optical fiber link to have at least double its previous bandwidth. By avoiding the need to redesign the ASICs that are used in the backplane, a substantial cost savings is realized while still achieving the much higher bandwidth of the upgraded optical fiber link. It should be noted that while the embodiments of the invention have been described with respect to upgrading an optical fiber link, the invention applies equally to building a new optical fiber link that uses the optical communications systems 20 or 60 described above with reference to FIGS. 2 and 3, respectively.

It should be noted that the invention has been described with reference to a few illustrative embodiments for the purpose of demonstrating the principles and concepts of the invention. For example, although a particular logical configuration has been described with reference to FIG. 5 for performing the phase alignment and rate conversion processes within the gearbox IC, those skilled in the art will understand that a variety of logical configurations may be used for this purpose and that the invention is not limited to using the particular logical configuration shown in FIG. 5. The invention is not limited to the embodiments described herein, as will be understood by those of ordinary skill in the art in view of the description provided herein. Many modifications may be made to the embodiments described herein without deviating from the goals or objectives of the invention, and all such modifications are within the scope of the invention.

What is claimed is:

1. A gearbox integrated circuit (IC) comprising:
  a first electrical interface having N input terminals for inputting N electrical data signals having a data rate of X gigabits per second (Gbps) and N output terminals for outputting N electrical data signals having a data rate of X Gbps, wherein N is a positive integer that is equal to or greater than two and X is a positive number that is equal to or greater than one;
  phase-alignment circuitry for phase-aligning pairs of the N inputted electrical data signals to produce N/2 pairs of phase-aligned electrical data signals;
  first rate conversion circuitry that receives the N/2 phase-aligned pairs of electrical data signals and converts each of the N/2 phase-aligned pairs into a serialized electrical data signal having a data rate of 2X Gbps;
  a second electrical interface having N/2 output terminals and N/2 input terminals, the serialized 2X Gbps electrical data signals being outputted from the gearbox IC via the N/2 output terminals of the second electrical interface; and
  second rate conversion circuitry that receives N/2 2X Gbps electrical data signals inputted to the gearbox IC via the N/2 input terminals of the second electrical interface and that converts the N/2 2X Gbps electrical data signals into N electrical data signals having a data rate of X Gbps that are outputted from the gearbox IC via the N output terminals of the first electrical interface.

2. The gearbox IC of claim 1, wherein the phase-alignment circuitry comprises:
  N/2 pairs of clock and data recovery (CDR) circuits electrically coupled to the N input terminals of the first electrical interface, each pair of CDR circuits receiving a pair of the N electrical data signals inputted via the first electrical interface and processing the respective pair of electrical data signals to generate first and second clock signals, CLK1 and CLK2, respectively, wherein clock signal CLK1 is aligned with a rising or falling edge of a first one of the electrical data signals of the respective pair and wherein clock signal CLK2 is aligned with a rising or falling edge of a second one of the electrical data signals of the respective pair; and
  N/2 de-skew circuits, each de-skew circuit using the first and second clock signals CLK1 and CLK2 to phase-align a respective pair of the N electrical data signals to produce one of the phase-aligned pairs of the N electrical data signals.

3. The gearbox IC of claim 2, wherein the first rate conversion circuitry comprises:
  N/2 serializer circuits, each serializer circuit receiving one of the phase-aligned pairs of the N electrical data signals and one of the clock signals CLK1 and CLK2 and converting the respective pair of the N electrical data signals into the serialized 2X Gbps electrical data signal, each serialized 2X Gbps electrical data signal being output from an output terminal of the respective serializer circuit.

4. The gearbox IC of claim 3, further comprising:
  N/2 de-emphasis drivers, each of the N/2 de-emphasis drivers receiving a respective one of the serialized 2X Gbps electrical data signals output from the output terminal of one of the N/2 serializer circuits, each de-emphasis circuit de-emphasizing and amplifying the respective serialized 2X Gbps electrical data signal before outputting the respective serialized 2X Gbps electrical data signal from the respective output terminal of the second electrical interface of the gearbox IC.

5. The gearbox IC of claim 4, further comprising:
  N equalizers, each of the N equalizers equalizing one of the respective N electrical data signals input to the gearbox IC via one of the input terminals of the first electrical interface of the gearbox IC before the respective electrical data signal is received by the respective pair of CDR circuits.

6. The gearbox IC of claim 1, wherein the second rate conversion circuitry further comprises:
  N/2 CDR circuits, each of the N/2 CDR circuits performing clock and data recovery on a respective one of said N/2 electrical data signals inputted to the gearbox IC via the N/2 input terminals of the second electrical interface to produce a respective electrical data signal having a data rate of 2X Gbps and a respective clock signal having a frequency of 2X gigahertz (GHz), each of the N/2 CDR circuits outputting the respective 2X Gbps electrical data signal from an output terminal thereof; and
  N/2 1-to-2 multiplexers (MUXes), each MUX having an input terminal electrically coupled to the output terminal of one of the N/2 CDR circuits for receiving a respective one of the 2X Gbps electrical data signals outputted from the N/2 CDR circuits, each of the N/2 MUXes deserializing the 2X Gbps electrical data signals into two X Gbps electrical data signals and outputting the two X Gbps electrical data signals via two output terminals of the respective MUX to the N output terminals of the first electrical interface of the gearbox IC to be outputted from the gearbox IC.

7. The gearbox IC of claim 6, wherein the first gearbox IC further comprises:
  N de-emphasis drivers, each of the N de-emphasis drivers receiving one of the two X Gbps electrical data signals output from one of the output terminals of a respective one of the MUXes and de-emphasizing and amplifying the respective X Gbps electrical data signal before the X Gbps electrical data signal is output from one of the N output terminals of the first electrical interface of the gearbox IC.

8. The gearbox IC of claim 1, wherein X is approximately equal to 10.

9. The gearbox IC of claim 8, wherein N is equal to 8.

10. A method for performing rate conversion and phase alignment in a gearbox integrated circuit (IC), the method comprising:
  in a first electrical interface of the gearbox IC, having N input terminals and N output terminals, inputting N electrical data signals having a data rate of X gigabits per second (Gbps), wherein N is a positive integer that is equal to or greater than two and X is a positive number that is equal to or greater than one;

in phase-alignment circuitry of the gearbox IC, phase-aligning pairs of the N inputted electrical data signals to produce N/2 pairs of phase-aligned electrical data signals;

in first rate conversion circuitry of the gearbox IC, receiving the N/2 phase-aligned pairs of electrical data signals from the phase-alignment circuitry and converting each of the N/2 phase-aligned pairs into a serialized electrical data signal having a data rate of 2X Gbps;

from a second electrical interface of the gearbox IC having N/2 output terminals and N/2 input terminals, outputting the serialized 2X Gbps electrical data signals from the gearbox IC via the N/2 output terminals of the second electrical interface;

in second rate conversion circuitry of the gearbox IC, receiving N/2 2X Gbps electrical data signals inputted to the gearbox IC via the N/2 input terminals of the second electrical interface and converting the N/2 2X Gbps electrical data signals into N X Gbps electrical data signals having a data rate of X Gbps; and outputting the N X Gbps electrical data signals from the gearbox IC via the N output terminals of the first electrical interface.

11. The method of claim 10, wherein the phase-alignment circuitry comprises:

N/2 pairs of clock and data recovery (CDR) circuits electrically coupled to the N input terminals of the first electrical interface, each pair of CDR circuits receiving a pair of the N electrical data signals inputted via the first electrical interface and processing the respective pair of electrical data signals to generate first and second clock signals, CLK1 and CLK2, respectively, wherein clock signal CLK1 is aligned with a rising or falling edge of a first one of the electrical data signals of the respective pair and wherein clock signal CLK2 is aligned with a rising or falling edge of a second one of the electrical data signals of the respective pair; and N/2 de-skew circuits, each de-skew circuit using the first and second clock signals CLK1 and CLK2 to phase-align a respective pair of the N electrical data signals to produce one of the phase-aligned pairs of the N electrical data signals.

12. The method of claim 11, wherein the first rate conversion circuitry comprises N/2 serializer circuits, and wherein the method further comprises:

with each serializer circuit, receiving one of the phase-aligned pairs of the N electrical data signals and one of the clock signals CLK1 and CLK2 and converting the respective pair of the N electrical data signals into the serialized 2X Gbps electrical data signal, each serialized 2X Gbps electrical data signal being output from an output terminal of the respective serializer circuit.

13. The method of claim 12, further comprising:

with each of N/2 de-emphasis drivers of the gearbox IC, receiving a respective one of the serialized 2X Gbps electrical data signals output from the output terminal of one of the N/2 serializer circuits and de-emphasizing and amplifying the respective serialized 2X Gbps electrical data signal before outputting the respective serialized 2X Gbps electrical data signal from the respective output terminal of the second electrical interface of the gearbox IC.

14. The method of claim 13, further comprising:

with each of N equalizers of the gearbox IC, equalizing one of the respective N electrical data signals input to the gearbox IC via one of the input terminals of the first electrical interface of the gearbox IC before the respective electrical data signal is received by the respective pair of CDR circuits.

15. The method of claim 10, wherein the second rate conversion circuitry further comprises N/2 CDR circuits and N/2 1-to-2 multiplexers (MUXes), and wherein the method further comprises:

with each of the N/2 CDR circuits, performing clock and data recovery on a respective one of said N/2 electrical data signals inputted to the gearbox IC via the N/2 input terminals of the second electrical interface to produce a respective electrical data signal having a data rate of 2X Gbps and a respective clock signal having a frequency of 2X gigahertz (GHz), each of the N/2 CDR circuits outputting the respective 2X Gbps electrical data signal from an output terminal thereof; and with each of the N/2 1-to-2 multiplexers (MUXes), receiving a respective one of the 2X Gbps electrical data signals outputted from the N/2 CDR circuits, deserializing the respective 2X Gbps electrical data signals into two X Gbps electrical data signals, and outputting the two X Gbps electrical data signals via two output terminals of the respective MUX to the N output terminals of the first electrical interface of the gearbox IC to be outputted from the gearbox IC.

16. The method of claim 15, wherein the first gearbox IC further comprises N de-emphasis drivers, and wherein the method further comprises:

with each of the N de-emphasis drivers, receiving one of the two X Gbps electrical data signals output from one of the output terminals of a respective one of the MUXes and de-emphasizing and amplifying the respective X Gbps electrical data signal before the X Gbps electrical data signal is output from one of the N output terminals of the first electrical interface of the gearbox IC.

17. The method of claim 10, wherein X is approximately equal to 10.

18. The method of claim 17, wherein N is equal to 8.

19. A gearbox integrated circuit (IC) comprising:

a first electrical interface having N input terminals for inputting N electrical data signals having a first data rate and N output terminals for outputting N electrical data signals having the first data rate, where N is a positive integer that is equal to or greater than two;

phase-alignment circuitry for phase-aligning pairs of the N inputted electrical data signals to produce M pairs of phase-aligned electrical data signals, where M is a positive integer that is equal to or greater than one;

first rate conversion circuitry that receives said M pairs of phase-aligned electrical data signals and converts each pair into a respective serialized electrical data signal having a second data rate that is higher than the first data rate;

a second electrical interface having at least M output terminals and at least M input terminals, the serialized electrical data signals being outputted from the gearbox IC via the M output terminals of the second electrical interface; and second rate conversion circuitry that receives M electrical data signals having the second data rate inputted to the gearbox IC via the M input terminals of the second electrical interface and that converts the M electrical data signals having the second data rate into N electrical data signals having the first data rate that are outputted from the gearbox IC via the N output terminals of the first electrical interface.

20. The gearbox IC of claim 19, wherein M is equal to N/2.

21. The gearbox IC of claim 19, wherein the second data rate is at least twice the first data rate.

22. The gearbox IC of claim 19, wherein the first data rate is X gigabits per second, (Gbps), where X is a positive number that is equal to or greater than one and where the second data rate is at least 2X Gbps.

23. A method for performing rate conversion and phase alignment in a gearbox integrated circuit (IC), the method comprising:

- in a first electrical interface of the gearbox IC, having N input terminals and N output terminals, inputting N electrical data signals having a first data rate, where N is a positive integer that is equal to or greater than two;
- in phase-alignment circuitry of the gearbox IC, phase-aligning pairs of the N inputted electrical data signals to produce M pairs of phase-aligned electrical data signals, where M is a positive integer that is equal to or greater than one;
- in first rate conversion circuitry of the gearbox IC, receiving the M phase-aligned pairs of electrical data signals from the phase-alignment circuitry and converting each of the phase-aligned pairs into a respective serialized electrical data signal having a second data rate that is higher than the first data rate;
- from a second electrical interface of the gearbox IC having at least M output terminals and M input terminals, outputting the serialized electrical data signals from the gearbox IC via the M output terminals of the second electrical interface;
- in second rate conversion circuitry of the gearbox IC, receiving M electrical data signals having the second data rate inputted to the gearbox IC via the M input terminals of the second electrical interface and converting the received M electrical data signals into N electrical data signals having the first data rate; and
- outputting the N electrical data signals converted from the received M electrical data signals from the gearbox IC via the N output terminals of the first electrical interface.

24. The method of claim 23, wherein M is equal to N/2.

25. The method of claim 23, wherein the second data rate is at least twice the first data rate.

26. The method of claim 23, wherein the first data rate is X gigabits per second, (Gbps), where X is a positive number that is equal to or greater than one and where the second data rate is at least 2X Gbps.

* * * * *